United States Patent
Morioka

(10) Patent No.: US 7,803,518 B2
(45) Date of Patent: Sep. 28, 2010

(54) METHOD FOR MANUFACTURING MICRO STRUCTURE

(75) Inventor: Hiroshi Morioka, Kanagawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 626 days.

(21) Appl. No.: 11/790,943

(22) Filed: Apr. 30, 2007

(65) Prior Publication Data

US 2007/0202445 A1     Aug. 30, 2007

Related U.S. Application Data

(63) Continuation-in-part of application No. 11/269,579, filed on Nov. 9, 2005, now abandoned.

(30) Foreign Application Priority Data

Aug. 15, 2005 (JP) ............................. 2005-235435
Aug. 11, 2006 (JP) ............................. 2006-219119

(51) Int. Cl.
   *G03F 7/26* (2006.01)
(52) U.S. Cl. ....................................... 430/313; 430/311
(58) Field of Classification Search ................. 430/311, 430/313
See application file for complete search history.

(56) References Cited

U.S. PATENT DOCUMENTS

| 6,368,982 | B1 * | 4/2002 | Yu ............................. 438/753 |
| 6,482,726 | B1 * | 11/2002 | Aminpur et al. ............ 438/585 |
| 2007/0212889 | A1 * | 9/2007 | Abatchev et al. ............ 438/717 |

FOREIGN PATENT DOCUMENTS

| JP | 2004-031944 | 1/2004 |
| JP | 2004-530922 | 10/2004 |
| JP | 2005-045214 | 2/2005 |
| WO | WO 02/080239 | 10/2002 |

* cited by examiner

*Primary Examiner*—Kathleen Duda
(74) *Attorney, Agent, or Firm*—Westerman, Hattori, Daniels & Adrian, LLP

(57) ABSTRACT

A method for forming a pattern includes the steps of: (a) preparing a lower hard mask layer and an upper hard mask layer stacked on an etching target film; (b) forming a resist pattern above the upper hard mask layer; (c) etching the upper hard mask film by using the resist pattern as an etching mask to form an upper hard mask; (d) after the step (c), removing the resist pattern; (e) after the step (d), thinning the upper hard mask by etching; (f) etching the lower hard mask film by using the thinned upper hard mask as an etching mask to form a lower hard mask; and (g) etching the etching target film by using the upper hard mask and the lower hard mask as an etching mask. The method for forming a pattern can etch a fine pattern with good yield.

20 Claims, 9 Drawing Sheets

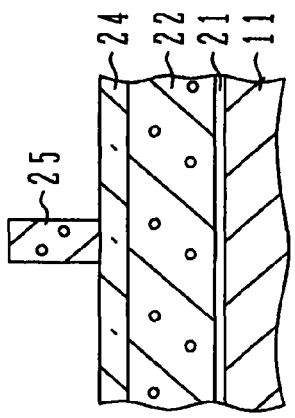
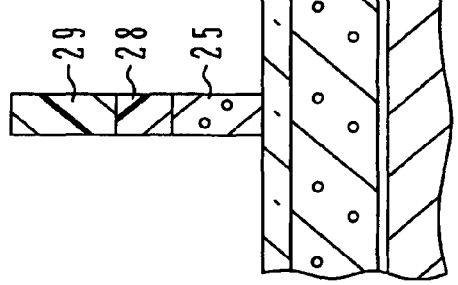
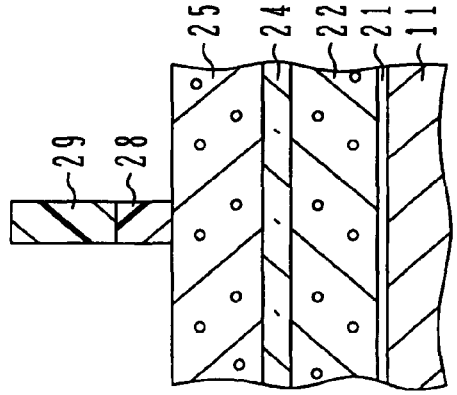
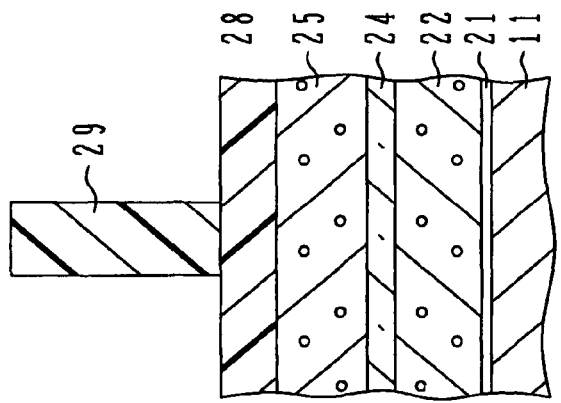
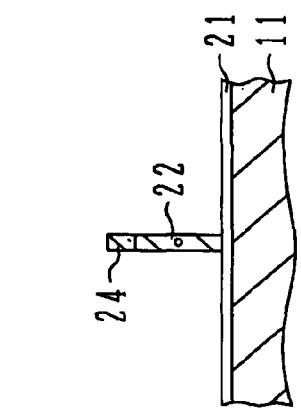
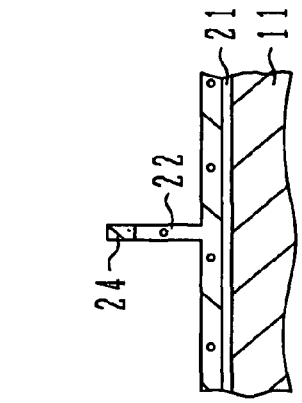
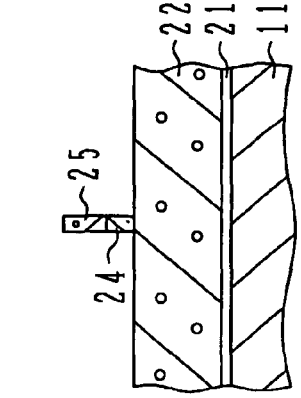
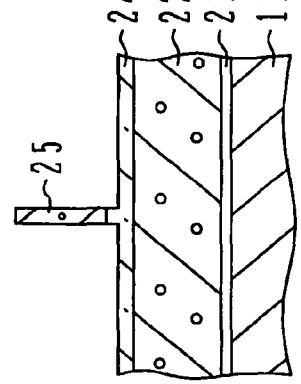
FIG.1A  FIG.1B  FIG.1C  FIG.1D
FIG.1E  FIG.1F  FIG.1G  FIG.1H

FIG.2

| PROCESS | PRESSURE mtorr | SOURCE POWER W | BIAS VOLTAGE Vp | ETCHING GAS (sccm) | | | | | | ETCH TIME sec |
|---|---|---|---|---|---|---|---|---|---|---|
| | | | | Cl$_2$ | HBr | O$_2$ | He | SO$_2$ | CF$_4$ | |
| BARC | 5 | 330 | 100 | | | 20 | 60 | 7 | | 18.4 |
| BT | 5 | 330 | 100 | | | | | | 100 | 10 |
| UHM ME | 8 | 550 | 125 | 15 | 120 | | | | 15 | 45 |
| UHM OE | 80 | 385 | 145 | | 150 | 5 | 150 | | | 40 |
| ASH | 10 | 1000 | 30 | | | 150 | | | 50 | 20 |
| TRIM | 10 | 1000 | 20 | | | 100 | | | 100 | 40 |
| LHM | 5 | 330 | 100 | | | | | | 100 | 10 |
| GME1 | 8 | 550 | 125 | 15 | 120 | 5 | | | 15 | 25 |
| GME2 | 8 | 385 | 65 | | 180 | 5 | | | | 20 |
| GOE | 80 | 385 | 145 | | 150 | | 150 | | | 40 |

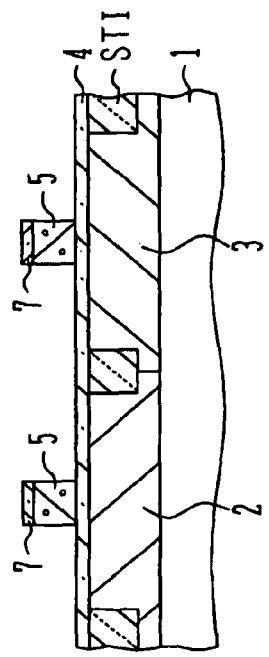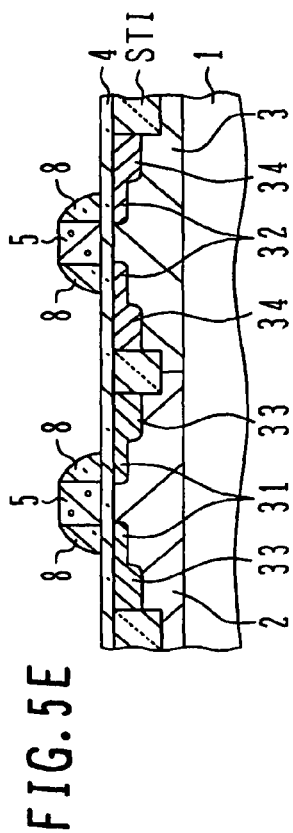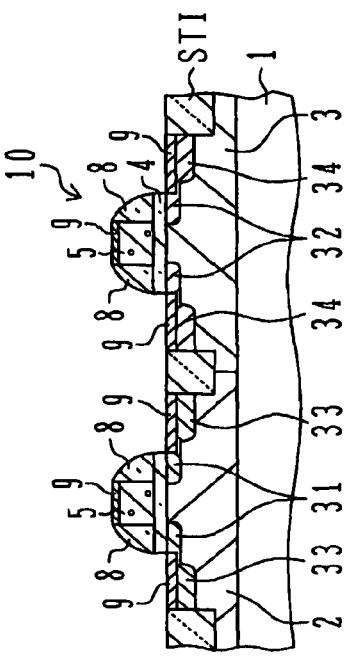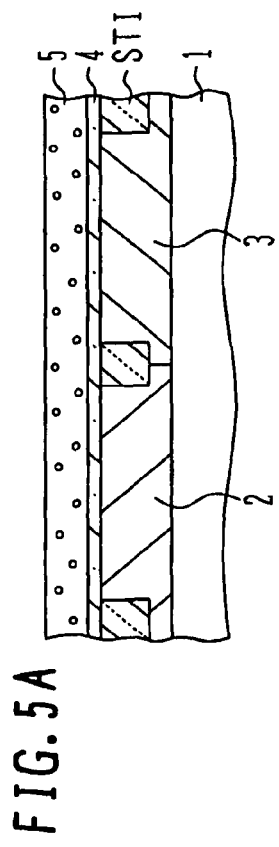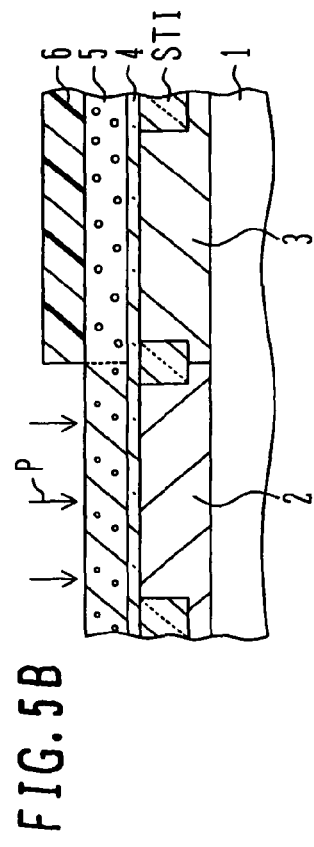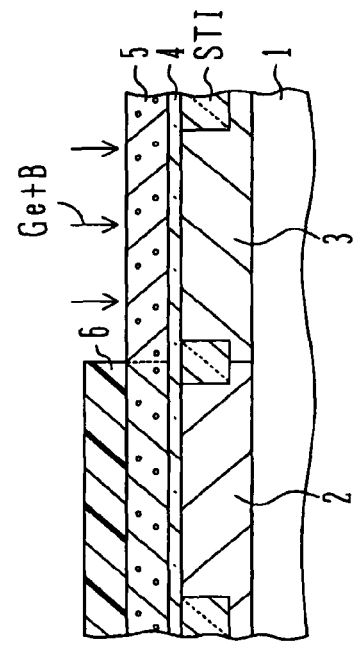

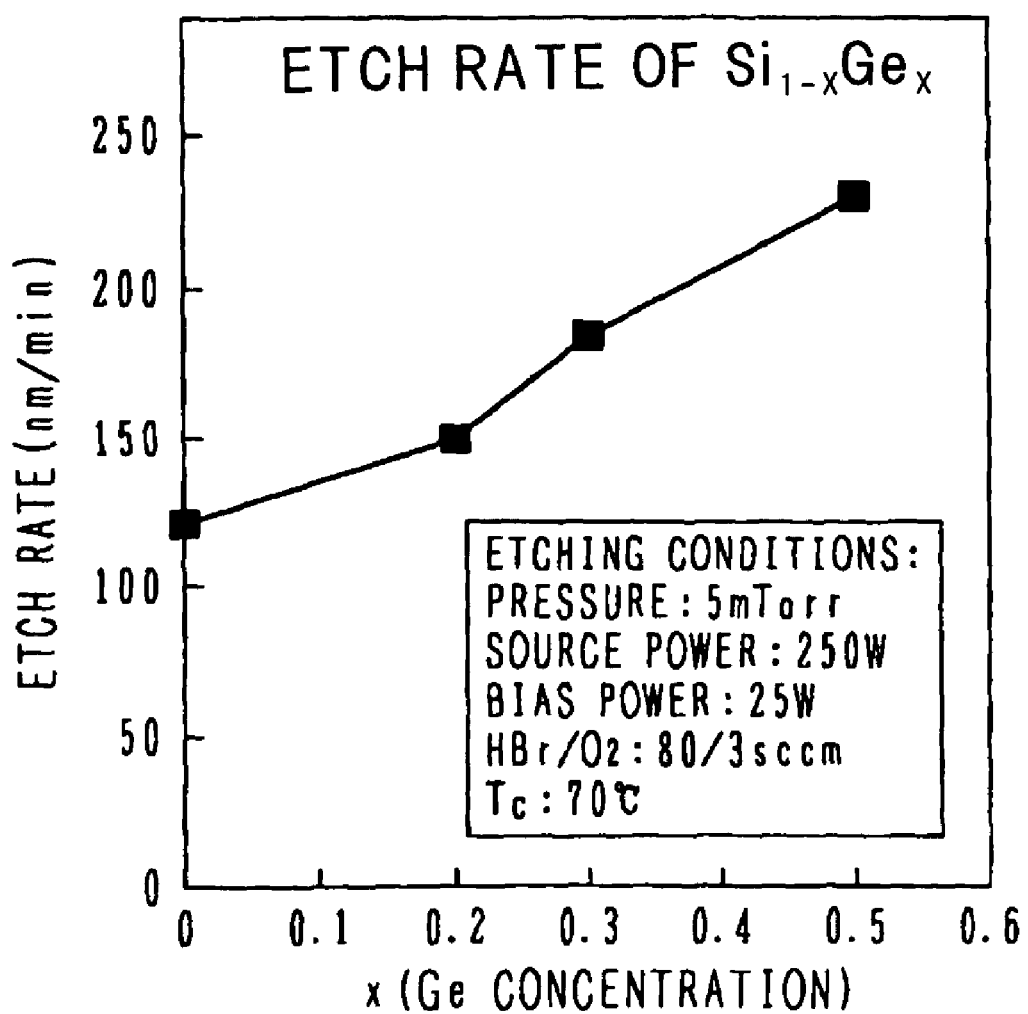

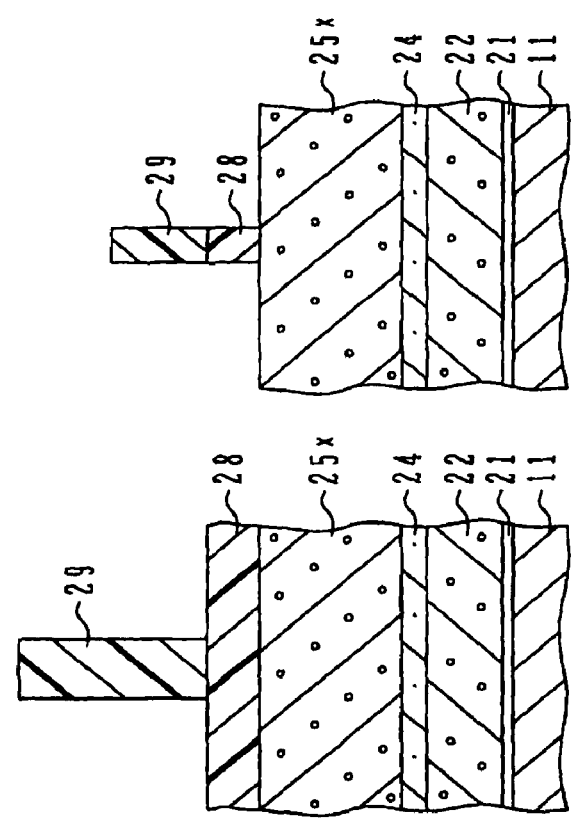
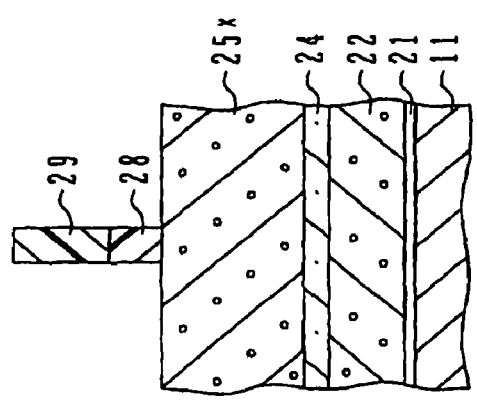
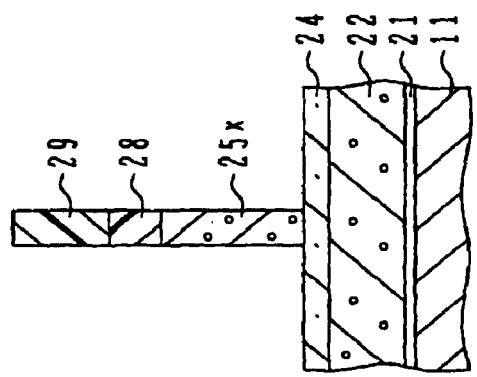
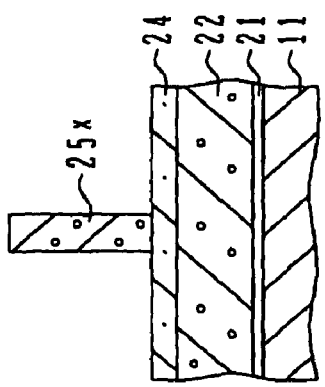
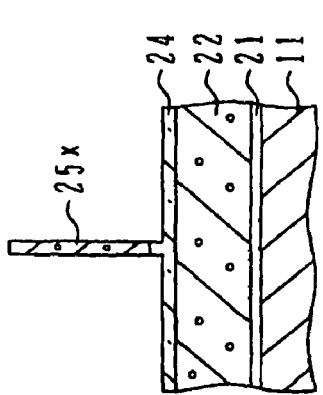
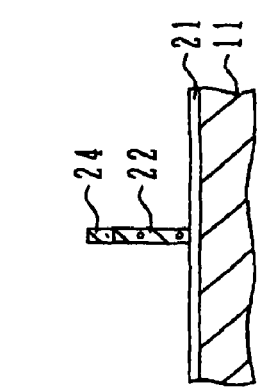
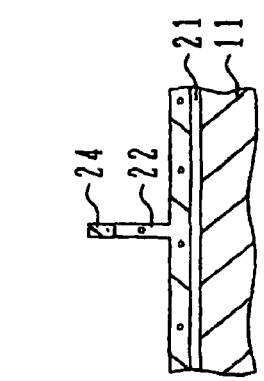
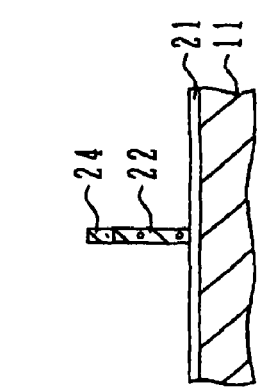
FIG. 9A  FIG. 9B  FIG. 9C  FIG. 9D
FIG. 9E  FIG. 9F  FIG. 9G  FIG. 9H

METHOD FOR MANUFACTURING MICRO STRUCTURE

CROSS REFERENCE TO RELATED APPLICATION

This application is a continuation-in-part application of U.S. patent application Ser. No. 11/269,579 filed on Nov. 9, 2005 which is now abandoned.

This application additionally claims priority of Japanese patent applications No. 2005-235435 filed on Aug. 15, 2005, and No. 2006-219119 filed on Aug. 11, 2006, the entire contents of which are incorporated herein by reference.

BACKGROUND OF THE INVENTION

A) Field of the Invention

The present invention relates to a manufacture method for a micro structure, and more particularly to a manufacture method for a micro structure having a pattern narrower than the minimum size of a resist pattern exposed and developed.

B) Description of the Related Art

The current processing of semiconductor devices generally uses techniques of etching various films such as silicon films, silicon oxide films, and silicon nitride films by reactive ion etching (RIE) using a resist pattern formed by lithography. A light source of photolithography has changed from KrF excimer laser (wavelength 248 nm) to ArF excimer laser (wavelength 193 nm) to form finer resist patterns. Resist material changes with the wavelength of an exposure light source.

Each photolithography technique has its own attainable minimum size. Trimming is performed to realize a pattern width narrower than the minimum size. For example, fine line patterns having a width of 100 nm or narrower are necessary for forming a gate electrode of a MOS transistor and a bit line of DRAM. These fine resist patterns having a width of 100 nm or narrower are formed by narrowing (trimming) a wider initial resist pattern by isotropic etching.

Japanese Patent Laid-open Publication No. 2004-31944 demonstrates the technique of forming a hard mask film of silicon oxide, silicon nitride, silicon oxynitride or the like on a gate electrode poly-silicon (polycrystalline silicon) film, forming a resist pattern for 248 nm on the hard mask film, trimming the resist pattern by isotropic etching, etching the hard mask film, removing the left resist pattern by ashing, and etching the poly-silicon film by using the hard mask film as a mask. This Publication points out the problems that at the exposure wavelength of 193 nm, resist is not so stable, edge roughness having coarse pattern lines increases, a resist film thickness after trimming is insufficient, or if a height is made sufficient, the resist pattern falls.

An embodiment of Japanese Patent Laid-open Publication No. 2004-31944 proposes a method of etching a film. According to this method, resist material mainly used is photosensitive to a short wavelength of 193 nm but is not stable. After a resist pattern is formed on a hard mask film, the resist pattern is transferred to the hard mask film by etching, both the resist pattern and hard mask film are trimmed at the same time to form a pattern having a desired size, thereafter an etching target film is etched. For example, the hard mask film has a three-layer structure of a silicon-rich silicon nitride film, a silicon oxynitride film and a silicon oxide film. Trimming is not performed before the hard mask is etched.

Japanese Patent Disclosed Publication No. 2004-530922 proposes a method of forming a resist pattern through exposure and development, reforming a surface layer of the resist pattern with an electron beam to set different etch rates between vertical and horizontal directions, and trimming the resist pattern by etching having preference to the horizontal direction to extinguish the reformed surface layer at the same time when trimming is completed.

Japanese Patent Laid-open Publication No. 2005-45214 proposes a method of realizing a uniform pattern width in a process of forming a resist pattern through exposure and development and trimming the resist pattern having a desired width. According to this method, if widths of exposed and developed resist patterns are different because of sparse/dense pattern distributions, differences between pattern widths are compensated by the trimming process to realize a uniform pattern width.

SUMMARY OF THE INVENTION

An object of this invention is to provide a method for forming a pattern capable of etching a fine pattern with good yield.

Another object of this invention is to provide a fine pattern manufacture method capable of etching a narrow pattern while using a resist pattern is limited in the range where deformation of the resist pattern can be easily prevented.

According to one aspect of the present invention, there is provided a method for forming a pattern comprising the steps of: (a) preparing a lower hard mask layer and an upper hard mask layer stacked on an etching target film; (b) forming a resist pattern above said upper hard mask layer; (c) etching said upper hard mask film by using said resist pattern as an etching mask to form an upper hard mask; (d) after said step (c), removing said resist pattern; (e) after said step (d), thinning said upper hard mask by etching; (e etching said lower hard mask film by using said thinned upper hard mask as an etching mask to form a lower hard mask; and (g) etching said etching target film by using said upper hard mask and said lower hard mask as an etching mask.

The resist pattern is used as a mask for etching the upper hard mask. The upper hard mask can be patterned more easily than the lower hard mask by using the resist pattern as a mask. The resist pattern can therefore be transferred to the upper hard mask with good controllability. At the time when the upper hard mask film is trimmed to form an object fine pattern, the resist pattern which might cause pattern defects is already removed so that generation of pattern defects can be prevented. A fine pattern is transferred from the upper hard mask to the lower hard mask, and the etching target film is etched by using the upper and lower hard masks as an etching mask so that the fine pattern can be manufactured with good yield.

BRIEF DESCRIPTION OF THE DRAWINGS

FIGS. 1A to 1H are cross sectional views of a semiconductor substrate illustrating main processes of a method for forming a pattern according to a first embodiment.

FIG. 2 is a table summarizing the conditions of processes of the first embodiment.

FIGS. 5A to 5F are cross sectional views of a semiconductor substrate illustrating a manufacture method for a CMOS semiconductor device applying the first embodiment method.

FIG. 8 is a graph showing change of etch rate of poly-$Si_{1-x}Ge_x$ with respect to the Ge composition x.

FIGS. 9A to 9H are cross sectional views of a semiconductor substrate illustrating main processes of a manufacture method of a micro structure according to a modification of the first embodiment.

DESCRIPTION OF THE PREFERRED EMBODIMENTS

First, preliminary studies made by the present inventor will be described.

If the processing size becomes small, e.g., 100 nm or narrower, an aspect ratio (height/width) of a resist pattern becomes very large in order to obtain a resist film thickness necessary for RIE of an etching target film, and there occurs a phenomenon that a resist pattern is deformed by thermal stress or the like due to ion collision during dry etching.

Even if an aspect ratio is small, the shape of a fine resist pattern changes because of fast erosion at a sharp edge, and defect patterns such as broken lines are likely to be formed.

Figure 3A:
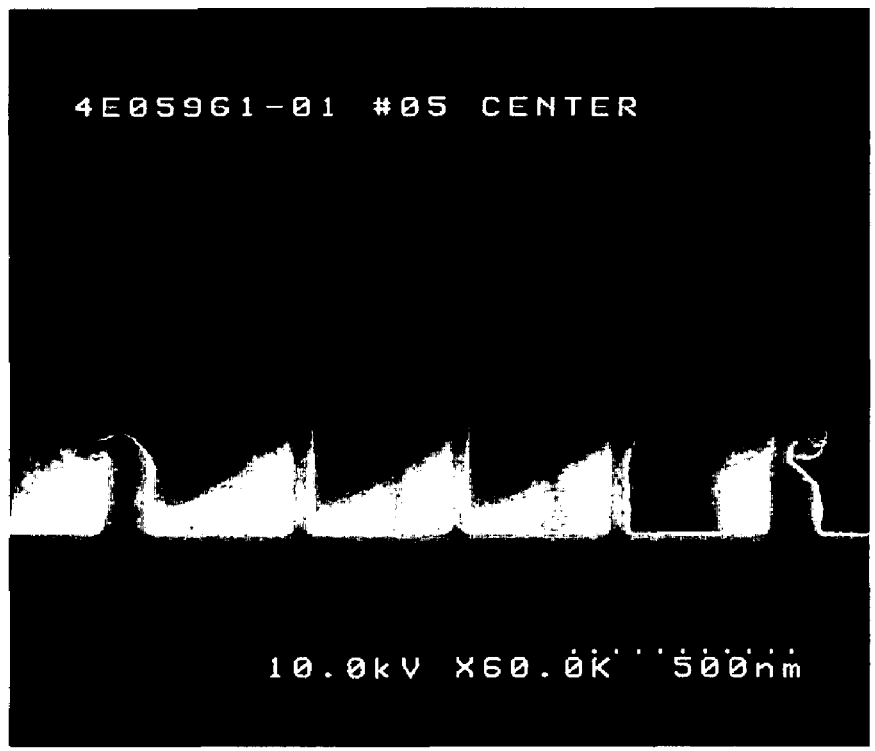
FIGS. 3A and 3B are SEM photographs showing samples of gate electrodes of poly-silicon formed according to prior art.
Figure 3B:

FIGS. 3A and 3B show defective shapes of resist patterns when a poly-silicon gate electrode layer is subjected to RIE by using resist patterns as a mask. A pattern at the rightmost in FIG. 3A is abnormal. FIG. 3B is an enlarged view of the rightmost pattern. The resist pattern, having a width of 50 nm or narrower if the resist is not damaged, is bent and the pattern width as viewed in plan increases greatly, because of thermal stress due to RIE ion collision and damages due to halogen radicals or the like having high reactivity. With this shape change, the pattern width of the lower poly-silicon film broadens greatly. A fine resist pattern is likely to be deformed by the influence of RIE.

It can be considered that a resist pattern can be lowered by transferring a resist pattern to a hard mask film and etching an etching target film by using the hard mask film as an etching mask. However, this approach does not solve the problem that a fine resist pattern is likely to be deformed. In order to etch a silicon oxide film, a silicon nitride film, a silicon oxynitride film, a lamination thereof and the like which are often used conventionally as a hard mask, it is necessary to use ions having a higher energy than that for etching poly-silicon. The influence of this high energy ions upon a fine resist pattern cannot be neglected. It is desired to form a hard mask capable of mitigating the influence upon a resist pattern.

First, an upper hard mask is processed by using as a mask a resist pattern having a width capable of suppressing falling and breaking of the resist pattern. It is desired to select material of the upper hard mask which material is easy to be patterned by using the resist pattern and has good formability. After the resist pattern is removed, the upper hard mask is trimmed. The resist pattern is removed before the upper hard mask defines a target fine pattern. Since the resist causing defective patterns such as falling and braking does not exist when an upper hard mask pattern defining the target fine pattern is formed, defective patterns can be avoided.

If silicon such as poly-silicon and amorphous silicon is used as the material of the upper hard mask film, the upper hard mask film can be dry-etched by using gas which contains halogen element such as HBr capable of suppressing a resist film reduction and by using a resist pattern as a mask. In preliminary tests, fine patterns having a width of about 50 nm were able to be processed without any defect. Narrowing the width of a resist pattern by trimming it before an upper hard mask is etched is not essential in the present invention. However, this trimming may be performed because the amount of subsequent trimming of the upper hard mask can be reduced. Both the trimming processes may be combined properly.

Material capable of being etched with good controllability without giving large damages to a resist pattern does not necessarily have the good property as a hard mask. If an etching target film is made of silicon, a hard mask made of only silicon cannot be used. A hard mask having a lamination structure is therefore used.

The upper hard mask layer is trimmed to transfer it to a lower hard mask layer having a high resistance against RIE. An etching target film is processed by using the upper and lower hard mask films as an etching mask.

With reference to FIGS. 1A to 1H, the first embodiment will be described. FIGS. 1A to 1H are cross sectional views of a semiconductor substrate illustrating main processes of a method for forming a pattern. A series of etching/trimming processes is executed by using, for example, an inductively coupled plasma (ICP) etcher. A table in FIG. 2 shows a summary of process conditions.

As shown in FIG. 1A, the surface of a silicon substrate 11 is thermally oxidized and nitrogen or the like is introduced to form a silicon oxynitride film 21 having a thickness of about 1 nm, the silicon oxynitride film constituting a gate insulating film. A poly-silicon film 22 constituting gate electrodes is deposited on the gate insulating film 21 to a thickness of 105 nm by thermal CVD. The poly-silicon film 22 is an etching target film. A silicon oxide film 24 as a lower hard mask film is deposited on the poly-silicon film 22 to a thickness of 30 nm by thermal CVD, and a poly-silicon film 25 as an upper hard mask film is deposited on the silicon oxide film 24 to a thickness of 105 nm by thermal CVD. A bottom antireflection film (BARC) 28 for ArF lithography having a thickness of, e.g., 76 nm and an ArF resist film 29 having a thickness of, e.g., about 200 to 250 nm are formed on and above the upper hard mask film 25. The BARC film 28 is an organic film having a composition similar to that of the resist film 29 although it has no photosensitivity.

The resist film is exposed and developed with an ArF excimer laser beam to form a resist pattern 29 having a width of 150 nm or narrower, e.g., about 80 nm to 100 nm. The width 80 nm is considerably wider than a final target pattern width. The BARC film 28 is etched by using the resist pattern 29 as a mask. For example, the underlying silicon surface was exposed by etching for 18.4 seconds by using mixture gas of $He/O_2/SO_2$ (flow rate: 60/20/7 sccm) or the like under the conditions of an in-chamber pressure of 5 mtorr (665 mPa), an RF source power of 330 W and an RF bias peak voltage of 100 V.

As shown in FIG. 1B, over-etching is performed to trim a lamination of the resist pattern 29 and BARC pattern 28. While the BARC film 28 is over-etched, the lamination of the resist pattern 29 and BARC pattern 28 is trimmed to a width of, e.g., about 40 to 50 nm. For example, the over-etching of 30% is performed after detecting an etching end point when the underlying poly-silicon film is exposed. The lamination of the trimmed resist pattern 29 and BARC pattern 28 is used as a mask pattern for etching the poly-silicon film 25.

As a breakthrough (BT) for exposing a clean silicon surface by removing an oxide film possible formed on the silicon surface, a surface cleaning process is performed for 10 seconds by changing etching gas to $CF_4$ (flow rate: 100 sccm).

As shown in FIG. 1C, the poly-silicon film 25 as the upper hard mask (UHM) is etched by RIE to transfer the resist pattern to the upper hard mask film 25, by using as a mask the lamination of the resist pattern 29 and BARC pattern 28 and using etching gas which contains HBr as a main composition. The etching gas which contains HBr as a main composition provides a small resist pattern film reduction. It is therefore possible to transfer the resist pattern to the upper hard mask at a high precision. The side walls of the upper hard mask can be made vertical.

For example, as a main etching (ME), RIE is performed for 45 seconds by using mixture gas of $Cl_2$/HBr/$CF_4$ (flow rate: 15/120/15 sccm) under the conditions of an in-chamber pressure of 8 mtorr (1064 mPa), an RF source power of 550 W and an RF bias peak voltage of 125 V. As an over-etching (OE), RIE is performed for 40 seconds by using mixture gas of HBr/$O_2$/He (flow rate: 150/5/150 sccm) under the conditions of an in-chamber pressure of 80 mtorr (10640 mPa), an RF source power of 385 W and an RF bias peak voltage of 145 V.

As shown in FIG. 1D, while the vacuum state is maintained, the lamination of the resist pattern 29 and BARC pattern 28 is removed by ashing (ASH) by changing etching gas to $O_2$/$CF_4$ or the like. By adding $CF_4$ gas to $O_2$ gas, it is possible to remove the lamination of the resist pattern 29 and BARC pattern 28 and residues derived from Si.

For example, ashing is performed for 20 seconds by using mixture gas of $O_2$/$CF_4$ (flow rate: 150/50 sccm) under the conditions of a pressure of 10 mtorr (1330 mPa) an RF source power of 1000 W and an RF bias peak voltage of 30 V.

As shown in FIG. 1E, the upper hard mask pattern 25 of poly-silicon is trimmed (TRIM) by using etching gas of $O_2$/$CF_4$ or the like. The width of the trimmed hard mask is 100 nm or narrower, e.g., 15 to 20 nm. This width is a target pattern width.

For example, trimming is performed for 40 seconds by using etching gas of $O_2$/$CF_4$ (flow rate: 100/100 sccm) under the conditions of an in-chamber pressure of 10 mtorr (1330 mPa), an RF power of 100 W and an RF bias peak voltage of 20 V. A ratio of $CF_4$ to $O_2$ is raised to etch silicon at a proper etching (trimming) rate.

As shown in FIG. 1F, the silicon oxide film 24 as the lower hard mask (LHM) is etched by RIE by using etching gas of $CF_4$ or the like and using the upper hard mask pattern as a mask. The hard mask of silicon oxide is widely used and has high process stability and reliability.

For example, RIE is performed for 25 seconds by using $CF_4$ gas (flow rate: 100 sccm) under the conditions of an in-chamber pressure of 5 mtorr (665 mPa), an RF source power of 330 W and an RF bias peak voltage of 100 V.

As shown in FIG. 1G, the poly-silicon film 22 as an etching target film is etched by RIE by using HBr/$O_2$ or the like as etching gas. The upper hard mask 25 of poly-silicon is also etched. Since the thickness of the upper hard mask of poly-silicon is set equal to the thickness of the etching target film of poly-silicon, the upper hard mask is extinguished before completion of etching the etching target film. The whole thickness of the lower hard mask 24 is maintained until the upper hard mask 25 is completely etched.

For example, as a first main etching (GME1) for gate electrodes, the main region of the etching target layer is etched by RIE for 25 seconds by using mixture gas of $Cl_2$/HBr/$CF_4$ (flow rate: 15/120/15 sccm) under the conditions of an in-chamber pressure of 8 mtorr (1064 mPa), an RF source power of 550 W and an RF bias peak voltage of 125 V. In the state that a portion of the etching target layer is left, the etching is switched to a second main etching (GME2) having a higher etching selectivity to gate oxynitride.

For example, etching is performed for 20 seconds by using mixture gas of HBr/$O_2$ (flow rate: 180/5 sccm) under the conditions of an in-chamber pressure of 8 mtorr (1064 mPa), an RF source power of 385 W and an RF bias peak voltage of 65 V. After the etching end point is detected, over-etching (GOE) is performed at an etching selectivity raised further. For example, over-etching is performed for 40 seconds by using mixture gas of HBr/$O_2$/He (flow rate: 150/5/150 sccm) under the conditions of an in-chamber pressure of 80 mtorr (10640 mPa), an RF source power of 385 W and an RF bias peak voltage of 145V.

As shown in FIG. 1H, the upper hard mask 25 of poly-silicon is extinguished before the whole thickness of the poly-silicon film 22 as the etching target film is etched.

Figure 4:
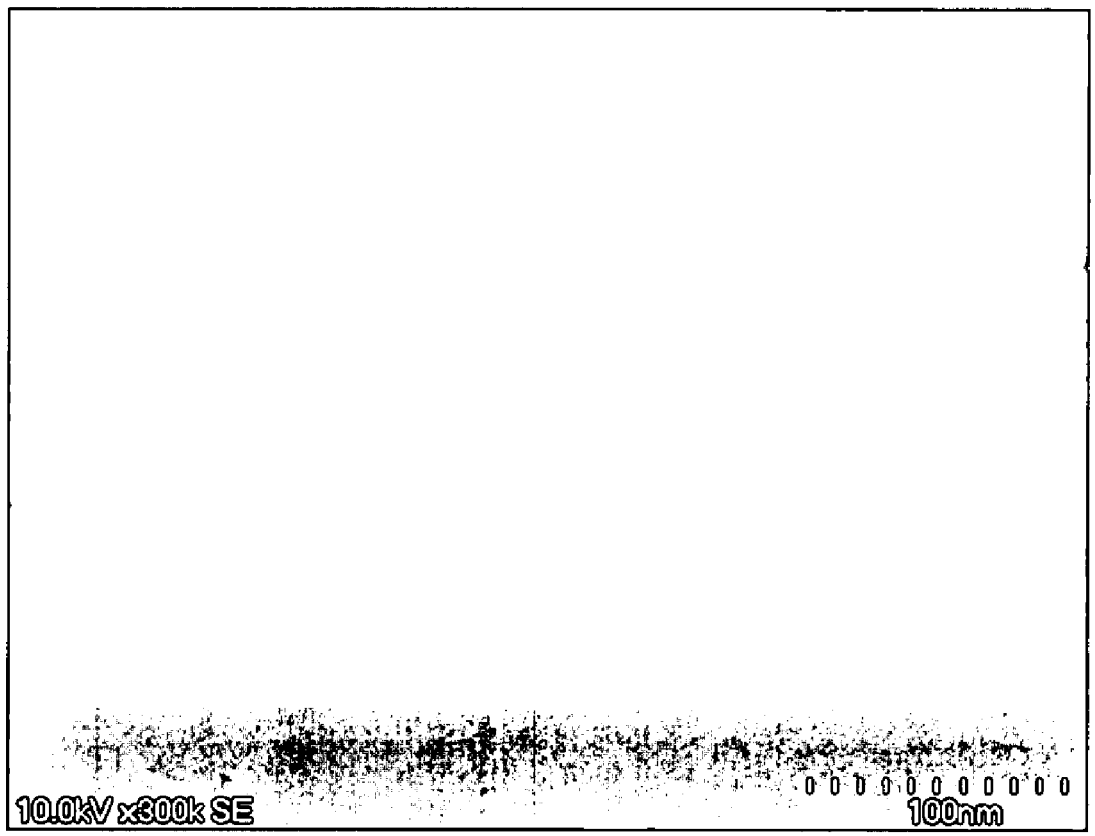
FIG. 4 is a SEM photograph showing samples of gate electrodes of poly-silicon formed according to the first embodiment.

FIG. 4 is a SEM photograph showing poly-silicon gate electrodes formed by the first embodiment method. It can be seen that poly-silicon patterns having a width of about 15 to 20 nm are formed without pattern falling and breaking.

The characteristic feature of the first embodiment resides in that the upper hard mask film is made of poly-silicon, the lower hard mask film is an inorganic insulating film conventionally used as a hard mask film, and after the upper hard mask film is patterned by using the resist pattern, the resist pattern is removed to realize the state that the resist pattern does not exist when the upper hard mask film is trimmed to a target pattern width. The feature of the first embodiment also resides in that the etching target film of poly-silicon is etched by using as an etching mask the lamination of the upper and lower hard mask patterns to remove the upper hard mask pattern at the same time while the etching target film is patterned.

If a wafer is exposed in the atmospheric air after the upper hard mask is etched and before the resist pattern is removed, side wall deposition is oxidized or absorbs moisture in the atmospheric air. There is a possibility that pattern falling or the like occurs due to stress applied to the fine resist pattern. It is therefore preferable to maintain a vacuum atmosphere during the period from the upper hard mask etching to the ashing. For example, the processes shown in FIGS. 1B to 1D are executed in the same chamber. If a multi-chamber etcher is used, although it is not necessary to use the same chamber, it is preferable to move a wafer between chambers via a transport path in the vacuum atmosphere.

Stripping the resist pattern and trimming the upper hard mask are preferably performed under the chemistry of mixture of $O_2$ gas and gas which contains F such as $CF_4$. When the upper hard mask made of silicon material is etched, Si-containing by-products are deposited on the side walls. Residues cannot be removed completely only by $O_2$ gas ashing, resulting in a possible increase in line edge roughness. It is preferable to remove residues by using gas which can generate radicals of F-containing molecules. But, this is not necessary for wet process using HF or the like.

By selecting a mixture ratio of $O_2$ gas to F-containing gas such as $CF_4$, the lower hard mask can be etched at the same time while the upper hard mask is trimmed. It is possible in some cases to realize etching which is more inexpensive and has better controllability.

Stripping the resist pattern and trimming the upper hard mask can be performed basically by the same process series. These processes can be performed under the chemistry of mixture of $O_2$ gas and gas which contains F such as $CF_4$. With a proper amount of F, it is possible to realize a fast resist etching rate (ashing rate), the state without residues after resist removal, and a trimming rate (e.g., about 10 nm/min) capable of controlling the upper hard mask. If the amount of F is too large, the silicon etching rate rises excessively. At too high a etching rate, Si may be damaged during ashing and the shape and trimming controllability may be degraded. It is preferable to set F-containing gas flow less than $O_2$.

If silicon is etched in a large oxygen flow state, i.e., in a strong oxidizing state, the surface of silicon is oxidized and the surface of silicon oxide is etched with F-containing gas. In this case, the apparent etching rates of silicon and silicon oxide are close to each other. It becomes easy to obtain a low etching rate suitable for hard mask trimming.

During trimming the upper hard mask, the selectivity to the lower hard mask is not fundamentally an essential parameter. While the upper hard mask is trimmed, the lower hard mask may be etched. By trimming the upper hard mask and etching the lower hard mask at generally the same etch rate, the hard mask having vertical side walls can be formed.

It is preferable to etch and remove the upper hard mask film at the same time while the etching target film is etched, or to remove the upper hard mask film after the etching target film is etched. In the first embodiment, the etching target film and the upper hard mask film are made of poly-silicon having the same initial thickness, and upper hard mask thickness is less than etching target poly-silicon film just before gate poly-Si etch (shown in FIG. 1F); Therefore, the upper hard mask film is basically removed while the etching target film is etched. If the upper hard mask film is left even after the etching target film is etched because the upper hard mask is thicker or has different etching characteristics, it is preferable to remove the upper hard mask film after the etching target film is processed. If the upper hard mask of silicon is conductive, it may cause electric short. Also in this case, if the upper hard mask is removed, this adverse influence can be eliminated. If only the lower hard mask of an inorganic insulating film is left, compatibility with a conventional hard mask process can be enhanced.

With reference to FIGS. 5A to 5F, a manufacture method for a CMOS semiconductor device will be described.

As shown in FIG. 5A, element isolation regions are formed in a silicon substrate 1 by shallow trench isolation (STI), p- and n-type impurity ions are implanted via openings formed through resist masks to form an n-channel MOS transistor p-type well 2 and a p-channel MOS transistor n-type well 3. A gate insulating film 4 of silicon oxynitride and a poly-silicon film 5 are deposited on and above the silicon surface. The gate insulating film 4 and poly-silicon film 5 correspond to the gate insulating film 21 and gate electrode layer 22 shown in FIG. 1A, respectively.

As shown in FIG. 5B, the p-MOS region 3 is covered with a resist mask 6, and n-type impurity ions of phosphorus P are implanted into the poly-silicon film 5 above the n-MOS region at an acceleration energy of 10 keV and a dose of $1\times10^{15}/cm^2$ (hereinafter denoted as 1E15, and etc).

As shown in FIG. 5C, the n-MOS region 2 is covered with a resist mask 6, and neutral impurities Ge are implanted into the poly-silicon film 5 above the p-MOS region at an acceleration energy of 20 keV and a dose of 1E15 to pre-amorphousize the poly-silicon film 5. The amorphousized silicon film is effective for preventing B from being pierced. After pre-amorphousizing, p-type impurity ions B are implanted at an acceleration energy of 5 keV and a dose of 1E15. The amorphous silicon film is thereafter transformed into a poly-silicon film. At this time, implanted impurity ions may be activated.

A lower hard mask film of silicon oxide and an upper hard mask film of poly-silicon are formed on and above the poly-silicon film 5, and the processes shown in FIGS. 1A to 1H are executed to form gate electrodes having a desired gate length.

FIG. 5D shows the state that the gate electrodes are formed. The silicon oxide film 7 used as the lower hard mask is left on the poly-silicon film 5.

As shown in FIG. 5E, by using the gate electrode and a resist pattern as a mask, n-type impurity ions As are implanted into the n-MOS region to form n-type extensions 31. Similarly, by using the gate electrode and a resist pattern as a mask, p-type impurity ions B are implanted into the p-MOS region to form p-type extensions 32. Pockets may be formed by implanting impurity ions of the opposite conductivity types.

A silicon oxide film is deposited to a thickness of 100 nm by thermal CVD, for example, at 580 (C, and etched by RIE to leave side wall spacers 8 only on the side walls of the gate electrodes. The silicon oxide films 7 used as the lower hard mask are also etched and removed. Then, n-type impurity ions P are implanted into the n-MOS region and p-type impurity ions B are implanted into the p-MOS region, and the implanted ions are activated to form low resistance source/drain regions 33 and 34.

As shown in FIG. 5F, for example, a cobalt film is deposited by sputtering, and a salicide process is executed to form silicide layers 9. With these processes, a CMOS semiconductor device 10 is completed.

In the first embodiment, stacked on the gate insulating film of silicon oxynitride are the gate electrode layer of silicon as the etching target layer, the silicon oxide film as the lower hard mask, and the poly-silicon film as the upper hard mask. The materials of the gate insulating film, gate electrode, lower hard mask film and upper hard mask film are not limited to those described above. The etching target layer may not be a gate electrode but a wiring.

In the first embodiment described above, in the process shown in FIG. 1C, the poly-silicon film is used as the upper hard mask film 25 which can be etched by using as a mask the resist pattern having a limited thickness. In the process shown in FIG. 1G, the poly-silicon film as the etching target film is etched and the upper hard mask 25 is etched and removed. In the trimming process for the upper hard mask 25 shown in FIG. 1E and in the etching process for the lower hard mask 24 shown in FIG. 1F, a height of the upper hard mask reduces. For the safety purpose, the upper hard mask 25 is made to have the same thickness as that of the etching target film 22 so that the upper hard mask 25 can be removed reliably at the etching end point of the etching target film 22. Instead of poly-silicon, the material of the upper hard mask film 25 may be poly-silicon-germanium or poly-germanium (both are expressed by poly-$Si_{1-x}Ge_x$ ($0<x\leq1$).

FIG. 8 is a graph showing the etch rate of poly-$Si_{1-x}Ge_x$ relative to the Ge composition x when $HBr/O_2$ etching gas is used. The ordinate represents an etch rate in the unit of nm/min and the abscissa represents Ge composition x. X=0.1 means that Ge is contained by 10%. As the Ge composition is increased from 0 to 0.2, 0.3 and to 0.5, the etch rate gradually increases and has at x=0.5 an approximately two-fold of the etch rate at x=0. Although data is shown from an abscissa values of 0 to 0.5, poly-$S_{i-x}Ge_x$ can take a range of $0\leq x\leq1$. Data in FIG. 8 is obtained by using $HBr/O_2$ as etching gas. The tendency that the etch rate increases with the composition of Ge is widely common to the ordinary used halogen-containing gases, such as HBr, $Cl_2$, $CF_4$, $SF_6$, and their mixtures, used for etching conductive films such as Si, silicide, and metal films, although there are some differences of degree. This tendency does not change even when additive gases such as $O_2$, and $N_2$ are added. It is a general fact that the etch rate of poly-$Si_1$ x$Ge_x$ is higher than that of poly-silicon. More specifically, etching gases such as $HBr/Cl_2$, $HBr/Cl_2/CF_4$, $SF_6/N_2$ may be used for etching the target layer, in place of $HBr/O_2$. Small amount of $O_2$ may be added.

As the upper hard mask 25 is made of poly-$Si_{1-x}Ge_x$, the etch rate of the upper hard mask becomes faster than that of poly-silicon. For example, if the etch rate is two times that of poly-silicon, a thickness of the upper hard mask of poly-$Si_{1-x}Ge_x$ can be doubled. By using the resist pattern having a limited thickness, the upper hard mask of poly-$Si_{1-x}Ge_x$ having a doubled thickness can be removed reliably while the etching target layer 22 of poly-silicon is etched. As the upper hard mask 25 is thickened, the lower hard mask 24 shown in FIG. 1F can be etched more safely and reliably. A trimming rate of the upper hard mask can be made faster.

Description will be made on a modification of the first embodiment in which the upper hard mask is made of poly-$Si_{1-x}Ge_x$, and mainly on different points from the first embodiment.

FIGS. 9A to 9H are cross sectional views of a semiconductor substrate illustrating main processes of a method for forming a pattern according to a modification of the first embodiment. FIGS. 9A to 9H illustrate processes corresponding to those shown in FIGS. 1A to 1H.

As shown in FIG. 9A, an upper hard mask film 25x of poly-$Si_{1-x}Ge_x$ is deposited on a lower hard mask film of poly-silicon, for example, by thermal CVD using silane as a Si source and germane as a Ge source. A thickness of the upper hard mask 25x is set in such a manner that the upper hard mask film can be etched by using as a mask a resist pattern having a height hard to be deformed, and is made thicker than that of the poly-silicon upper hard mask 25 of the first embodiment. Other points are similar to the first embodiment.

A resist patterning process and a trimming process shown in FIG. 9B are similar to the processes shown in FIG. 1B of the first embodiment.

As shown in FIG. 9C, by using a resist pattern 29 as a mask, the upper hard mask film 25x of poly-$Si_{1-x}Ge_x$ is etched. As compared to the upper hard mask film of poly-silicon, the etch rate is faster so that the etching time is not necessary to be prolonged even for the thick upper hard mask film 25x.

An ashing process shown in FIG. 9D is similar to the ashing process shown in FIG. 1D of the third embodiment.

As shown in FIG. 9E, the upper hard mask 25x of poly-$Si_{1-x}Ge_x$ is trimmed. As compared to the upper hard mask film of poly-silicon, the trimming rate can be made faster. A proper etching rate can obviously be selected by adjusting the gas composition.

As shown in FIG. 9F, the lower hard mask film 24 is etched by using as a mask the thick upper hard mask 25x. Since the upper hard mask is thick, it is possible to mitigate the influence of the decrease of mask thickness.

As shown in FIGS. 9G and 9H, a poly-silicon layer 22 as an etching target film is etched and the upper hard mask 25x is removed. Since the etch rate of the upper hard mask film 25x is high, the upper hard mask film 25x can be etched reliably.

FIGS. 6A to 6D are cross sectional views of a semiconductor substrate illustrating main processes of a method for forming a pattern according to the second embodiment.

Figure 6A:
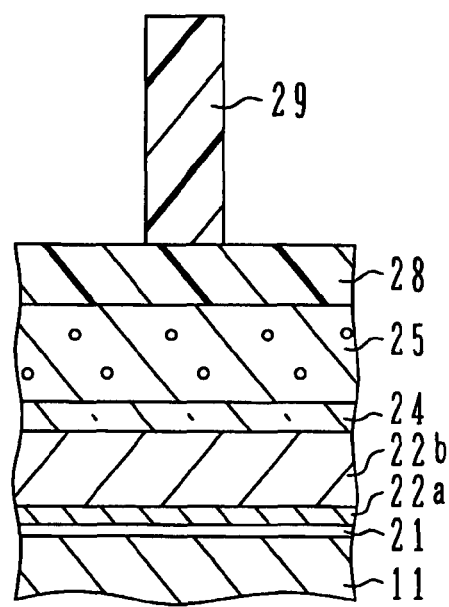
FIGS. 6A to 6D are cross sectional views of a semiconductor substrate illustrating main processes of a method for forming a pattern according to a second embodiment.

As shown in FIG. 6A, a gate insulating film 21 of HfSiON having a thickness of 5 nm is formed on the surface of a silicon substrate. A TiN layer 22a having a thickness of 10 nm and a W layer 22b having a thickness of 70 nm are stacked on the gate insulating film by CVD or sputtering (PVD) to form a gate electrode layer.

For example, the HfSiON film 21 is formed by thermally oxidizing the surface of the silicon substrate and growing an HfON film on silicon oxide by CVD. Nitrogen may be introduced after thermal oxidation. The HfSiON film may be grown by CVD. By using material having a dielectric constant higher than that of silicon oxide, the physical thickness of the gate insulating film can be made thick while a silicon oxide equivalent thickness is maintained low, and leakage current can be suppressed. The material having a dielectric constant higher than that of silicon oxide may be $ZrO_2$, $HfO_2$, $Al_2O_3$, AlHfSiON, $Ta_2O_5$, and these materials doped with N or Si.

The W layer 22b constitutes a main region of the gate electrode. The material of this layer may be other refractory metals such as Ta and Mo, and other metals such as Zr, Al, Ti and Ni. The TiN layer 21a determines a work function of the gate electrode. Depending upon a target work function, other materials may be used such as TaN, TaSiN, WN and Ru.

An SiN film 24 as a lower hard mask film having a thickness of 50 nm and a poly-silicon film 25 as an upper hard mask film having a thickness of 105 nm are formed on and above the gate electrode layer by thermal CVD or the like. The materials of the gate insulating film, gate electrode layer and lower hard mask film are different from those of the first embodiment. A BARC film 28 and a resist film 29 are formed by the processes similar to those of the first embodiment. The processes from a resist pattern forming process to an upper hard mask etching and trimming process are similar to those of the first embodiment.

Figure 6B:
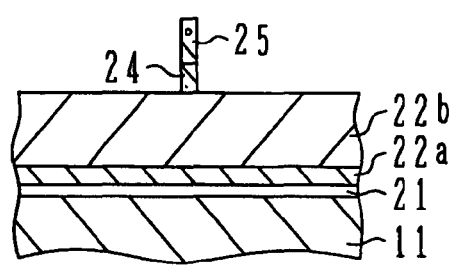

FIG. 6B illustrates a process of etching the lower hard mask film 24 of SiN. The SiN lower hard mask film 24 is etched by RIE using $CF_4$ or the like as etching gas. A hard mask for etching an etching target film is constituted of a lamination of the upper hard mask 25 of poly-silicon and the lower hard mask 24 of SiN.

Figure 6C:
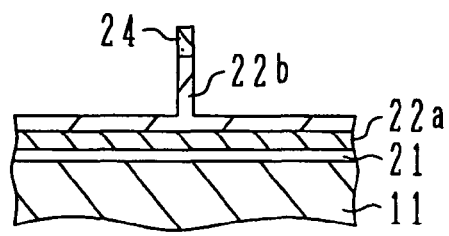

As shown in FIG. 6C, the W layer 22b is etched by RIE using mixture gas of $SF_6/N_2$ or the like. This etching extinguishes the upper hard mask 25 of poly-silicon. $NF_3$ gas may be used in place of $SF_6$ gas.

Figure 6D:
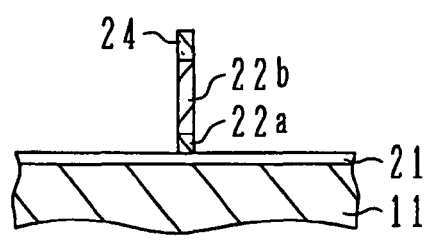

As shown in FIG. 6D, the TiN layer 22a is etched by using mixture gas of, for example, $Cl_2/BCl_3/CHF_3$. The gate insulating film 21 of HfSiON can be used as an etch stopper. Even if the upper hard mask of poly-silicon is left, it may be removed by using mixture gas of $HBr/O_2$ or the like in the state that the gate insulating film is exposed.

In the second embodiment, the upper hard mask film is made of Si and the main region of the gate electrode is made of W. A W film may be used as the upper hard mask film. In this case, the upper hard mask film and the etching target film are made of the same material and can be etched at the same time independently from the etching conditions. In the first and second embodiments, the gate insulating film is used as the etch stopper when the gate electrode is etched. Another film may be used as the etch stopper.

FIGS. 7A to 7D are cross sectional views of a semiconductor substrate illustrating the main processes of a method for forming a pattern according to the third embodiment.

Figure 7A:
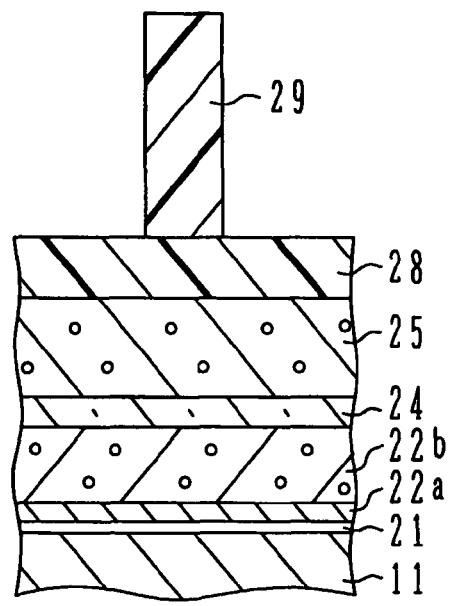
FIGS. 7A to 7D are cross sectional views of a semiconductor substrate illustrating main processes of a method for forming a pattern according to a third embodiment.

As shown in FIG. 7A, a poly-silicon film 22b having a thickness of 100 nm is formed on a TaN layer 22a having a thickness of 5 nm to form a gate electrode layer. The TaN layer is deposited by sputtering (reactive sputtering). Other lamination structures are similar to those of the first embodiment.

Figure 7B:
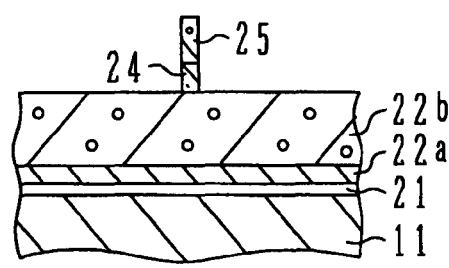

FIG. 7B shows the state that a hard mask is formed, corresponding to FIG. 1F. The silicon surface of the upper gate electrode layer 22b is exposed.

Figure 7C:
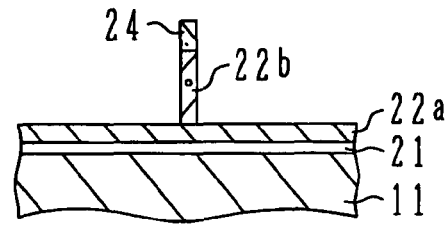

FIG. 7C shows the state that the poly-silicon gate electrode 22b is etched by using mixture gas of $HBr/O_2$ similar to the process shown in FIG. 1G. The TaN lower gate electrode 22a functions as an etch stopper. Even if the upper hard mask of poly-silicon is left, it can be removed at this stage by over-etching.

Figure 7D:
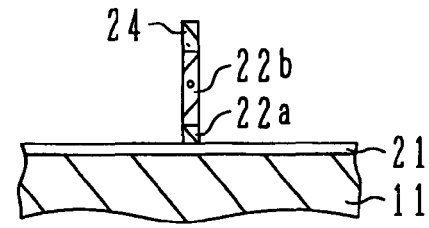

FIG. 7D shows the state that the lower gate electrode layer 22a is etched by using BCl$_3$ gas or the like.

The present invention has been described in connection with the preferred embodiments. The invention is not limited only to the above embodiments. For example, in the above embodiments, a wiring is formed by replacing the gate electrode layer with a wiring layer and the gate insulating film with an interlayer insulating film. Although the etching target film of silicon is etched by using HBr-containing gas, it may be etched by using gas which contains one or more of Cl$_2$, HBr, Br$_2$, HI, HCl and BCl$_3$. It will be apparent to those skilled in the art that other various modifications, improvements, combinations, and the like can be made.

What are claimed are:

1. A method for forming a pattern comprising the steps of:
   (a) forming a lower hard mask layer and an upper hard mask layer stacked on an etching object including an etching target film at an uppermost level;
   (b) forming a resist pattern above said upper hard mask layer;
   (c) etching said upper hard mask layer by using said resist pattern as an etching mask to form an upper hard mask;
   (d) after said step (c), removing said resist pattern;
   (e) after said step (d), thinning said upper hard mask by etching;
   (f) etching said lower hard mask layer by using said thinned upper hard mask as an etching mask to form a lower hard mask; and
   (g) etching said etching target film by using both said upper hard mask and said lower hard mask as an etching mask.

2. The method for forming a pattern according to claim 1, wherein said resist pattern includes an ArF resist film and an underlying antireflection film.

3. The method for forming a pattern according to claim 1, wherein said step (b) comprises the steps of:
   (b-1) exposing and developing said resist pattern; and
   (b-2) trimming said resist pattern.

4. The method for forming a pattern according to claim 1, wherein said step (g) removes said upper hard mask at the same time.

5. The method for forming a pattern according to claim 4, wherein said etching target film and said upper hard mask layer are both made of poly-silicon, said upper hard mask layer has a thickness equal to or thinner than said etching target film, and said step (g) removes said upper hard mask.

6. The method for forming a pattern according to claim 1, wherein said etching object has an etch stopper film under said etching target film, said step (g) etches said etching target film by using said etch stopper film as a stopper, and the method for forming a pattern further comprises the step of:
   (h) after said step (g), removing said upper hard mask being left by etching.

7. The method for forming a pattern according to claim 1, wherein the etching object is a micro structure of a semiconductor device, and said etching target film constitutes a gate electrode or a wiring.

8. The method for forming a pattern according to claim 7, wherein said etching target film and said upper hard mask layer each include a silicon film or a refractory metal film, and said lower hard mask layer is made of inorganic insulator.

9. The method for forming a pattern according to claim 8, wherein etching in said step (g) is performed by using etching gas which contains one or more of Cl$_2$, HBr, Br$_2$, HI, HCl and BCl$_3$.

10. The method for forming a pattern according to claim 7, wherein said etching target film includes a silicon film and said upper hard mask layer includes a Si$_{1-x}$Ge$_x$ ($0<x\leq1$) film.

11. The method for forming a pattern according to claim 10, wherein said upper hard mask layer is thicker than said etching target film.

12. The method for forming a pattern according to claim 7, wherein said etching target film constitutes a gate electrode, said etching target film and said upper hard mask layer are poly-silicon films, and said lower hard mask layer is a silicon oxide film or a silicon nitride film.

13. The method for forming a pattern according to claim 12, further comprises the step of:
   (i) after said step (g), depositing a silicon oxide film or a silicon nitride film covering said gate electrode, and reactive-etching said silicon oxide film or said silicon nitride film to form side wall spacers on side walls of said gate electrode, while removing said lower hard mask at the same time.

14. The method for forming a pattern according to claim 7, wherein said etching target film constitutes a gate electrode, said etching target film includes a TiN film and a W film formed on said TiN film.

15. The method for forming a pattern according to claim 14, wherein said step (g) includes the step of:
   (g-1) etching said W film by using said TiN film as an etch stopper.

16. The method for forming a pattern according to claim 7, wherein said etching target film constitutes a gate electrode, said etching target film includes a TaN film and a silicon film formed on said TaN film, and said upper hard mask layer is a silicon film.

17. The method for forming a pattern according to claim 16, wherein said step (g) includes the step of:
   (g-1) etching said silicon film by using said TaN film as an etch stopper.

18. The method for forming a pattern according to claim 1, wherein at least one of said steps (d) and (e) is executed by using etching gas which is a mixture of O$_2$-containing gas and fluorine-containing gas of at least one of CF$_4$, CH$_x$F$_y$, C$_x$F$_y$, SF$_6$ and NF$_3$.

19. The method for forming a pattern according to claim 18, wherein a ratio of the O$_2$-containing gas to the fluorine-containing gas in the etching gas is larger than 1.

20. The method for forming a pattern according to claim 1, wherein said step (e) etches said lower hard mask layer at the same time.

* * * * *